United States Patent
Goren et al.

(10) Patent No.: US 7,434,186 B1
(45) Date of Patent: Oct. 7, 2008

(54) METHOD AND SYSTEM FOR CALCULATING HIGH FREQUENCY LIMIT CAPACITANCE AND INDUCTANCE FOR COPLANAR ON-CHIP STRUCTURE

(75) Inventors: David Goren, Nesher (IL); Benny Sheinman, Haifa (IL); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/948,761

(22) Filed: Nov. 30, 2007

(51) Int. Cl.
  *G06F 17/50* (2006.01)
(52) U.S. Cl. .................... 716/5; 716/4; 703/2
(58) Field of Classification Search ............ 716/4–5; 703/2
  See application file for complete search history.

(56) References Cited

U.S. PATENT DOCUMENTS

| | | | |
|---|---|---|---|
| 6,742,167 | B2 | 5/2004 | Grau |
| 7,080,340 | B2 | 7/2006 | Goren et al. |
| 7,200,825 | B2 | 4/2007 | Watson et al. |
| 7,278,124 | B2 | 10/2007 | Shimazaki et al. |
| 2002/0042698 | A1 | 4/2002 | Meuris et al. |
| 2002/0116696 | A1 | 8/2002 | Suaya et al. |
| 2002/0147555 | A1 | 10/2002 | Nagata et al. |
| 2003/0065498 | A1 | 4/2003 | Bois et al. |
| 2003/0172358 | A1 | 9/2003 | Alon et al. |
| 2004/0133862 | A1 | 7/2004 | Naruta et al. |
| 2005/0149894 | A1 | 7/2005 | Shimazaki et al. |
| 2005/0251378 | A1 | 11/2005 | Zhao |
| 2005/0262458 | A1 | 11/2005 | Gordin et al. |
| 2006/0123376 | A1 | 6/2006 | Vogel et al. |
| 2006/0271888 | A1 | 11/2006 | Meuris et al. |
| 2006/0286691 | A1 | 12/2006 | Goren et al. |

FOREIGN PATENT DOCUMENTS

| | | |
|---|---|---|
| DE | 10109554 | 9/2002 |
| EP | 1170796 | 1/2002 |
| JP | 11231000 | 8/1999 |
| JP | 2001-202400 | 7/2001 |
| WO | 03/075189 | 9/2003 |

OTHER PUBLICATIONS

Ghione et al., "Revisiting the Partial-Capacitance Appoach to the Analysis of Coplanar Transmission Lines on Multilayered Substrates," IEEE, 2003, pp. 2007-2014.*

Banerjee, K., "Accurate Analysis of On-Chip Inductance Effects and Implications for Optimal Repeater Insertion and Technology Scaling (2001)," IEEE Symposium on VLSI Circuits, Kyoto, Japan, Jun. 14-16, 2001.

(Continued)

*Primary Examiner*—Vuthe Siek
(74) *Attorney, Agent, or Firm*—Scully, Scott, Murphy & Presser, P.C.; Suzanne Erez, Esq.

(57) ABSTRACT

Capacitance and inductance expressions used for modeling critical on-chip metal interconnects. A method for calculating high frequency limit capacitances $C_\infty$ and inductances $L_\infty$ of coplanar transmission line structures over silicon substrate utilizes field based expressions derived for a single coplanar T-line structures over silicon, and coupled coplanar T lines over silicon. For coupled coplanar structures, the field lines based calculation is performed separately for odd and even modes.

3 Claims, 2 Drawing Sheets

OTHER PUBLICATIONS

Cao, Y., et al., "Effects of Global Interconnect Optimizations on Performance Estimation of Deep Submicron Designs (2000)," in Proc. IEEE/ACM International Conference on Computer-Aided Design, 2000, pp. 56-61.

Chen, C. C.-P., et al., "Generalized FDTD-ADI: An Unconditionally Stable Full-Wave Maxwell's Equations Solver for VLSI Interconnect Modeling (2000) (Make Corrections),".

Harlander, C., et al., "A Comparative Study of Two Numerical Techniques for Inductance Calculation in Interconnect Structures," Conference: Simulation of semiconductor processes and devices, International Conference on Simulation of Semiconductor Processes and Devices, 2001, pp. 254-257.

Stroobandt, Dirk, Recent Advances in System-Level Interconnect Prediction (2000), IEEE CAS. Society Newsletter 11 (4) (2000), pp. 1;420.

Taylor, C., et al., Modeling and Minimization of Interconnect Energy Dissipation in Nanometer Technologies (2001), Design Automation Conference.

* cited by examiner

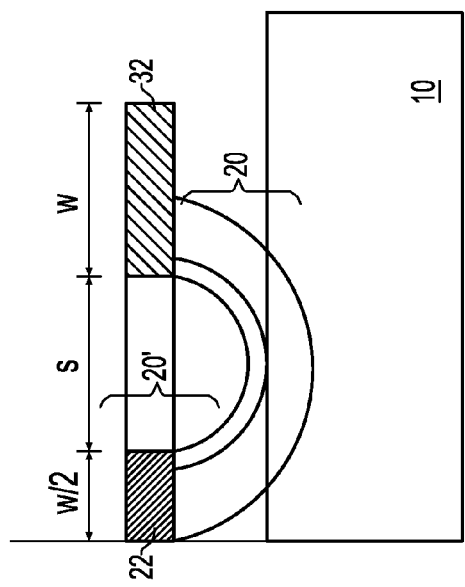
FIG. 1
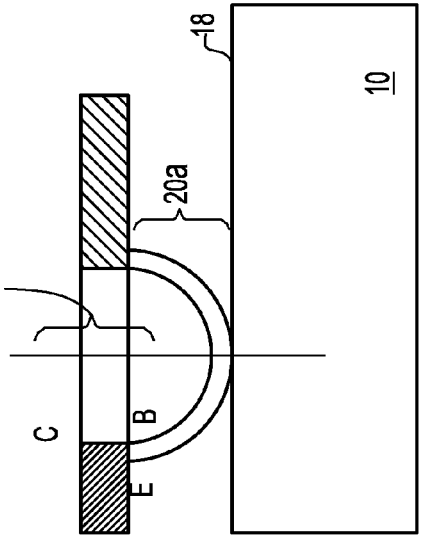
FIG. 3
FIG. 2
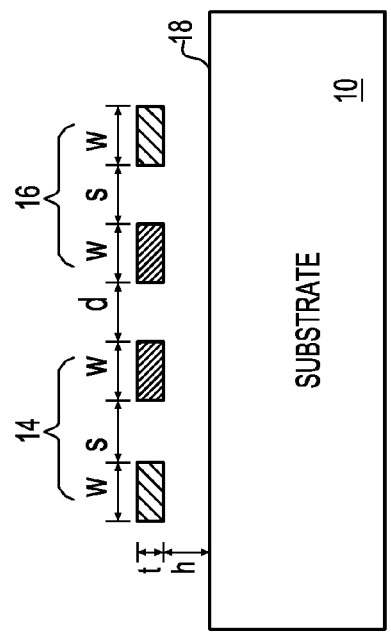
FIG. 4

METHOD AND SYSTEM FOR CALCULATING HIGH FREQUENCY LIMIT CAPACITANCE AND INDUCTANCE FOR COPLANAR ON-CHIP STRUCTURE

CROSS-REFERENCE TO RELATED APPLICATIONS

The present invention is related to commonly-owned, United States Patent Application No. US 2006/0286691 entitled "Capacitance Modeling", the entire contents and disclosure of which is incorporated by reference as if fully set forth herein, now U.S. Pat. No. 7,308,662.

BACKGROUND OF THE INVENTION

1. Field of the Invention

The present invention relates generally to the high speed electronic devices, and more particularly, to a method and system for calculating the high frequency capacitance and high frequency inductance limits (two separate, but connected problems) in two-dimensional (2D) on-chip interconnect structures.

2. Description of the Prior Art

High-speed electronic devices on silicon chips successfully operate today at frequencies up to 100 HGz, considering technologies such as SiGe and SOI. Coplanar transmission lines turn to be important on-chip interconnects for such devices. In order to have a model for coplanar structures on silicon substrates, the following low frequency and the high frequency limit values of the following electrical parameters have to be calculated: static capacitance $C_0$, infinite (high frequency limit) capacitance $C_\infty$, low frequency inductance $L_0$ and infinite (high frequency limit) inductance $L_\infty$. In addition to this, the low and high frequency values of the resistance and shunt conductance have to be calculated as well. Prior art techniques for capacitance and inductance calculation were developed mostly for calculation of the low frequency (static) capacitance $C_0$ and low frequency inductance $L_0$, since prior art applications were mainly for lower frequencies, where modeling of the static values is sufficient. The high frequency limit capacitance becomes important for transmission lines, or any metal conductor structures right above the silicon substrate at high frequencies (several GHz and higher) in which the silicon behaves as a dielectric material rather than like a metal. As is apparent from prior art teachings described in commonly-owned, co-pending United States Patent Publication No. 2005/0262458 filed on May 6, 2005 entitled "Modeling Capacitance of On-chip Coplanar Transmission Lines Over the Silicon Substrate", existing closed-form expressions for the coplanar transmission line high frequency limit capacitance are quite complex, and their accuracy is not always sufficient. Numerical calculations are time and memory consuming and may not be stable Moreover, the existing prior art solutions requires usage of an EM solver as described in the aforementioned United States Patent Publication No 2005/0262458. EM solver calculations are time consuming and may have convergence problems.

In commonly-owned, co-pending United States Patent Publication No. 2006/0286691 there was described methods for calculating the static capacitance. In the low frequency limit of US20060286691 the silicon is treated as a metal.

In commonly-owned, co-pending United States Patent Publication No. 2005/0262458 there is described a methodology that addresses the same problem of calculating the high frequency limit capacitance but using a very different imaging method, which is not based on a field lines approach. The method described in US 2005/0262458 is very complex. Moreover, none of these cited prior art references teach or suggest a method for the calculation of the high frequency limit inductance.

What would be highly desirable is to provide field based expressions for deriving and calculating high frequency capacitance $C_\infty$ and inductance $L_\infty$ of a coplanar transmission line structure over the silicon substrate, which are very compact and have the desired accuracy for many applications.

SUMMARY OF THE INVENTION

It is an object of the present invention to provide field based expressions for deriving and calculating high frequency capacitance $C_\infty$ and inductance $L_\infty$ of coplanar transmission line structures over a silicon substrate.

It is a further object of the present invention to provide field based expressions for deriving and calculating high frequency capacitance $C_\infty$ and inductance $L_\infty$ of coplanar transmission line (T-line) structures over a silicon substrate wherein the high frequency limit capacitance is calculated for: a single coplanar T-line structure over a substrate, or, a coupled coplanar T line over the silicon substrate.

It is a further object of the present invention to provide field based expressions for calculating a high frequency limit inductance for a case where no silicon substrate exists.

Thus, according to one aspect of the invention, there is provided a method implemented by a computer device, of modeling the high frequency limit capacitance of an on-chip interconnect structure disposed above a silicon substrate having a dielectric material layer, said interconnect structure including a conductor structure and a proximate side shield structure, said method comprising:

a) estimating a pattern of electric field lines within the silicon substrate structure and within the dielectric material layer, said estimated pattern of electric field lines comprising a curved field lines portion and straight lines portion between said conductor structure and a proximate side shield structure;

b) providing parameters to said computer device for characterizing said silicon substrate at said high frequency as a non-conductive dielectric material, said estimated pattern of electric field lines in said silicon substrate behaving according to said non-conductive, dielectric material characterization, one parameter including an effective dielectric constant $\in$ used for calculating partial capacitance expressions of said interconnect structure, said effective dielectric constant $\in$ calculated according to:

$$\alpha/\in_1 + \beta/\in_2 = (\alpha+\beta)/\in$$

wherein said curved field lines portion is divided into two series capacitance sections with a first section subtended by an angle $\alpha$ and a second section subtended by angle $\beta$, said angles defined relative to an intersection of a horizontal axis aligned with a lower surface of a signal conductor of said interconnect structure and a vertical axis aligned at the midpoint between the signal conductor and said side shield structure, and wherein curved field lines of said first section include lines located in a dielectric medium having permittivity $\in_1$ and curved field lines of said second section include lines located in a substrate medium having permittivity $\in_2$;

c) integrating over said estimated pattern of electric field lines to obtain a relationship between voltage and the electric field for regions of said structure and obtain respective partial capacitance expressions utilizing said effective dielectric constant ∈ for said regions that can be used to calculate the high frequency capacitance of said structure; and, d) obtaining a resulting capacitance expression for simulating the electrical behavior of said on-chip interconnect structure in an integrated circuit design system.

Further to this aspect of the invention, the pattern of field lines are half-circles The method may be used for modeling an on-chip interconnect structure comprising a single mode transmission line, the field lines approach used to obtain a single mode capacitance Csm expression comprising a function:

$$Csm = singleModePar(w, t, s, h)$$

where w, t, s, h parameters are input values with: "t" representing a thickness of a signal conducting line; "h" representing the spacing between a signal conducting line and a substrate surface; "w" representing the signal conducting line width; and "s" representing the conducting line separation distance.

The high frequency limit capacitance for the single coplanar T-line structure is based on the Csm function.

The method may be used for modeling an on-chip interconnect structure comprising a coupled coplanar T-line structure having two coplanar high frequency signal conducting lines, the field lines approach used to obtain a common mode capacitance Ccm expression comprising a function:

$$Ccm = commonModePar(w, t, s, h)$$

where w, t, s, h parameters are input values with: "t" representing a thickness of a signal conducting line; "h" representing the spacing between a signal conducting line and a substrate surface; "w" representing the signal conducting line width; and "s" representing the conducting line separation distance.

Advantageously, the system and method of the present invention may be applicable for modeling performance of electronic devices implementing high frequency conductive interconnect structures (e.g., transmission lines).

BRIEF DESCRIPTION OF THE DRAWINGS

The objects, features and advantages of the present invention will become apparent to one skilled in the art, in view of the following detailed description taken in combination with the attached drawings, in which:

FIG. 1 illustrates a first on-chip interconnect coplanar design case comprising a single signal line conductor with side shield structure over a substrate in which the high frequency limit capacitance formulas is derived according to a first aspect of the invention;

FIG. 2 illustrates a second on-chip interconnect coplanar design case comprising two coupled signal lines over substrate in which the high frequency limit capacitance formulas is derived according to one aspect of the invention;

FIG. 3 illustrates a field lines approach depicting half circle field lines below the signal and side shield structures and horizontal field lines between the signal line and side shield structures according to the methodology of the present invention.

FIG. 4 illustrates a first portion of the field lines approach depicted in FIG. 3 including half circle field lines below the signal line and side shield structures wherein the field lines do not cross the substrate.

DETAILED DESCRIPTION OF THE PREFERRED EMBODIMENTS

Figure 5:
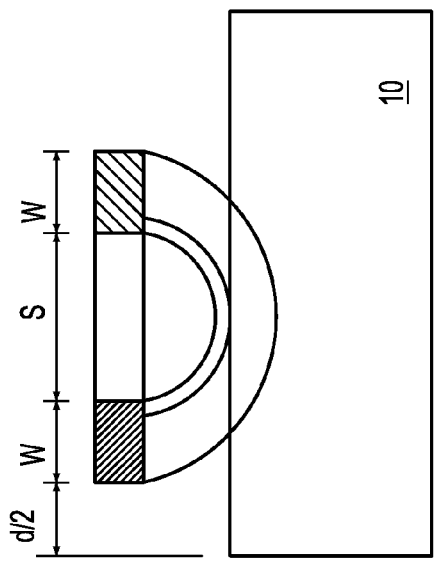
FIG. 5 illustrates a second portion of the field lines approach depicted in FIG. 3 including half circle field lines below the signal line and side shield structures wherein the field lines cross the substrate.

FIGS. 1 and 2 illustrate two main cases in which the high frequency limit capacitance may be determined in accordance with the present invention: As will be described in greater detail herein, the present invention calculates the high frequency limit capacitance in a manner derived explicitly from closed form expressions based on a field line approach, as opposed to a numerical methods approach.

FIG. 1 illustrates a first on-chip interconnect coplanar design case comprising a single signal line with side shields over substrate in which the high frequency limit capacitance is derived according to one aspect of the invention. As depicted in FIG. 1, the high frequency limit capacitance is calculated for a single signal conductive structure ("T-line") 12 having side shield conductors disposed a distance h over a silicon substrate 10. FIG. 2 illustrates a second on-chip interconnect coplanar design case comprising two coupled signal lines over substrate in which the high frequency limit capacitance is derived according to another aspect of the invention. In FIG. 2, there is depicted two coupled T-lines 14 and 16 disposed over a substrate 10.

In each of the embodiments depicted in FIGS. 1 and 2, for exemplary purposes, it is assumed each conductive line structure 12, 14 and 16 has a width "W" (or "w") and thickness "T" (or "t") calculation. A spacing between consecutive conductor lines is a value "S" (or "s") as shown in FIGS. 1 and 2, and a distance between the conductor lines and a top surface 18 of the substrate is a value "H" (or "h"). In both cases, the electromagnetic field lines emanating from the structures look similar as will be described. It is given that $\in_2$ is the dielectric constant of a portion of the silicon substrate 10 and $\in_1$ be the effective dielectric constant of the oxides and nitrides of Silicon or any other dielectric material being used.

The semiconductor material of the substrate may include, but is not limited to, silicon, germanium, silicon carbon alloy, gallium arsenide, indium arsenide, indium phosphide, III-V compound semiconductor materials, II-VI compound semiconductor materials, organic semiconductor materials, and other compound semiconductor materials. In one embodiment, the semiconductor material comprises silicon. In another embodiment, the semiconductor material comprises gallium arsenide.

For the high frequency limit capacitance calculations, due to the symmetry of the problem, it is possible to calculate capacitance for half of the geometry (right or left), as will be demonstrated in greater detail herein below. There are two types of basic calculations from which the solution for all cases is derived:

FIG. 3 illustrates a field lines pattern depicting half circle field lines below the signal and side shield conductor structures and horizontal field lines between the signal line and side shield conductor structures implemented for the high frequency limit capacitance calculation.

In the approach depicted in FIG. 3, there is depicted a semiconductor structure including field lines pattern 20 shown in FIG. 3 as a half circles emanating between a signal carrying conductor (e.g., T-line) 22 and a side shield conductor 32. It is understood that the field lines include horizontal field lines 20' between the signal conductor 22 and side shield conductor 32. Since half of the problem is being solved in FIG. 3, the width of the signal conductor is halved (i.e., w/2).

Referring now to FIGS. 4 and 5, there are respective two field lines patterns 20, 20' of FIG. 3 depicted that are relevant to the calculations that are supported in connection with the analysis provided herein in support of FIGS. 4, 5. Particularly, FIG. 4 illustrates a first field line pattern 20a where field lines including half circle field lines below the signal line and side shield conductor structures do not cross the substrate surface 18. FIG. 5 illustrates a second field line pattern 20b where field lines including half circle field lines below the signal line and side shield conductor structures do cross the substrate.

Figure 6:
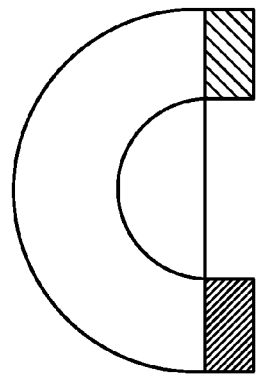
FIG. 6 illustrates a third portion of the field lines approach depicted in FIG. 3 including half circle field lines above the signal line and side shield structures.

A further portion of field lines 20c are shown in FIG. 6 which depicts half circle field lines 20c emanating above the T-line and side shield conductor structures.

Referring back to FIG. 5, a Z-Y axis is defined as shown that includes an origin labeled "O", wherein the Y-axis is aligned with the lower surface of the signal conductor 22 as shown in FIG. 5, and the side shield structure 32 and the Z-axis aligned at the midpoint between the signal conductor 22 and the side shield structure 32. For the analysis as described herein, it is assumed that the field line pattern 20 is divided into two sections 40 and 45, each section subtended by angles α and β, respectively, as shown in the third quadrant of the Z-Y axis in FIG. 5. From FIG. 5, it is assumed that the distance AF=FE, namely, that the interior half circle field line pattern 35 is equidistant from its adjacent interior half circle field line patterns 37, 39 in FIG. 5. Further to the analysis, as shown in FIG. 5, it is given that $\in_2$ is the dielectric constant of a portion of the silicon substrate 10 and $\in_1$ be the dielectric constant of a remaining portion of the structure, which typically includes silicon oxide dielectric material or other dielectric material. Further, the field line pattern 20 is divided into two series capacitance sections with the first section 40 subtended by angle α and the second section 45 subtended by angle β as shown in the third quadrant of the Z-Y axis in FIG. 5. That is, as shown in FIG. 5, it is assumed that for a sector α 40 having field lines 20b penetrating a small portion of the silicon substrate, the dielectric constant is $\in_1$; likewise, it is assumed that for a sector β 45 having field lines in the sector which penetrate the silicon substrate, the dielectric constant is $\in_2$. This is a simplifying approximation that helps the calculations developed herein below. Given these parameters and assumptions shown in FIGS. 1-5, there is provided approximate calculations for calculating the effective dielectric constant $\in$ for the structure shown in FIG. 1. That is, in the approximation, the effective dielectric constant $\in$ for two capacitors connected in series which are the capacitor due to the curved field lines in the dielectric $\in_1$ and the capacitor due to the curved field lines in the dielectric $\in_2$.

$$\alpha/\in_1 + \beta/\in_2 = (\alpha+\beta)/\in$$

or $$\in = (\in_1 * \in_2) * (\alpha+\beta)/(\in_2 * \alpha + \in_1 * \beta)$$

Further to the invention, a computer program is implemented to perform the following approximation for the effective dielectric constant:

$$\in = (\in_1 * \sin \alpha + \in_2 * \sin \beta)/(\sin \alpha + \sin \beta)$$

Single Mode Capacitance

The actual calculation of the single mode capacitance Csm, is now described in greater detail in view of the following equations. Dielectric constants of the substrate regions used in the analysis may be of the order of 4.1 (for $\in_1$, the relative dielectric constant for silicon oxide) and 11.9 (for $\in_2$, the relative dielectric constant for silicon); however, are design choices and subject to change. For example, in low-k technologies, $\in_1$ may be lower than 4.1 (e.g., may be 3.0 or 2.5) as insulators other than oxide may be used instead.

It is understood that for calculating the capacitance matrices for each on-chip coplanar transmission line topology the basic components of the capacitance calculation methodology are performed including, but not limited to, the steps of: 1) first drawing reasonable field line patterns for the investigated structure; 2) Calculating the length of each field line (e.g., via an expression=∫dl); 3) use the assumption that the electric field along the field line is constant; 4) Calculating the charge of the defined area by using Gauss's law; and 5) calculating the capacitance per unit length of the conductor (e.g., wire). These basic components of the capacitance calculation methodology are well known and described in detail for the co-planar T-line static capacitance determinations as described in commonly-owned, co-pending United States Patent Publication No. 2006/0286691 the whole contents and disclosure of which is incorporated by reference as if fully set forth herein.

The transmission line topology's capacitance is calculated using the solution of basic characteristic cases that serve as building blocks. Each of the building blocks follows the above basic steps for different field lines patterns that are shown herein in FIGS. 3-8.

What follows are the resultant capacitance calculations (determined expressions) for the field line patterns shown in FIG. 5 for the "Single mode" embodiment calculation for the structure shown in FIG. 1 (a single mode calculation for a single coplanar transmission line). In the following equations, the final capacitance Csm is determined as a sum of partial capacitance calculation results. For example, the $C_1$ capacitance is the capacitance between the parallel plates (i.e., horizontal field lines pattern 20' between the signal conductor and side shield conductor); the $C_2$ comprising partial result calculations for $C_{21}$, $C_{22}$, that is, capacitance of the field lines going from the signal conductor corners to the side shields conductors, and $C_3$ (comprising partial result calculations for $C_{31}$, $C_{32}$, for example) capacitance between the signal conductor and side shields conductors for the half circle field lines). These partial results are obtained from integrating along the field lines in different regions. The details of the derivations are explained in herein incorporated United States Patent Publication No. 2006/0286691.

$$C_1 = X(1) * \varepsilon_1 * \frac{t}{s}$$

$$C_2 = X(2) * \varepsilon_1 * \frac{1}{\pi - 2} * \ln\frac{\pi}{2}$$

$$C_3 = X(3) * \varepsilon_1 * \frac{1}{\pi} * \ln\left(1 + \frac{w}{s}\right)$$

where X(k), k=1, 2, ..., n are fitting parameters, whose usage will be discussed herein below.

For the case where the parameters meet the following design criteria:

h>0.5*(w+s), the calculated single mode capacitance Csm becomes:

$$Csm = 2*C_1 + 4*C_2 + 4*C_3$$

For the case where the parameters depicted in FIG. 1 meet the following design criteria:

0.5*(w+s)>=h>0.5*s, the $C_3$ capacitance component (comprising partial result calculations for $C_{31}$, $C_{32}$, $C_{3s}$) and the calculated single mode capacitance $C_{sm}$ are determined as follows:

$$C_{31} = \varepsilon_1 * \frac{1}{\pi} * \ln\left(2 * \frac{h}{s}\right)$$

$x_0 = 0.5*(0.5*(w+s)+h)$ (denoted as an intermediate notation)

$h_0 = \sqrt{x_0 * x_0 - h*h}$ (denoted as an intermediate notation)

$\in = (h*\in_1 + h_0*\in_2)/(h+h_0)$ $$C_{32} = \varepsilon * \frac{1}{\pi} * \log\frac{w+s}{2*h}$$

$C_{3s} = X(3)*(C_{31} + C_{=})$ $Csm = 2*C_1 + 4*C_2 + 2*(C_3 + C_{3s})$

For the case where the parameters depicted in FIG. 1 meet the following design criteria:

h<0.5*s, the $C_2$ capacitance component (comprising partial result calculations for $C_{21}$, $C_{22}$, for example) and $C_3$ capacitance component (comprising partial result calculations for $C_{31}$, $C_{32}$, for example) and the calculated single mode capacitance Csm are determined as follows:

$C_{31} = 0$ $x_0 = 0.5*(0.5*w+h)$ (an intermediate notation)

$h_0 = \sqrt{x_0 * x_0 - h*h}$ (an intermediate notation)

$\in = (h*\in_1 + h_0*\in_2)/(h+h_0)$ $$C_{32} = \varepsilon * \frac{1}{\pi} * \log\left(1 + \frac{w}{s}\right)$$

$C_{3s} = X(3)*(C_{31} + C_{32})$ $$C_{21} = \varepsilon_1 * \frac{1}{\pi - 2} * \ln\left(1 + \frac{(\pi - 2)*h}{s}\right)$$

$h_0 = 0.5*(0.5*s - h)$ (an intermediate notation)

$\in = (\in_1 * h + 0.75 * \in_2 * h0)/(h+h0)$ $$C_{22} = \varepsilon * \frac{1}{\pi - 2} * \ln(\pi * s / (2*(\pi - 2)*h + 2*s))$$

$C_{2s} = X(2)*(C_{21} + C_{22})$

As the foregoing equations apply to half of the structure, the capacitance is twice the obtained result:

$Csm = 2*C_1 + 2*(C_2 + C_{2s}) + 2*(C_3 + C_{3s})$ where X(k) are fitting parameters, whose usage will be discussed in greater detail herein below.

In view of the foregoing, and, as will be used in the subsequent description, a function for calculating of the single mode capacitance is indicated by: Csm=singleModePar(w, t, s, h).

Common Mode Capacitance

Figure 7:
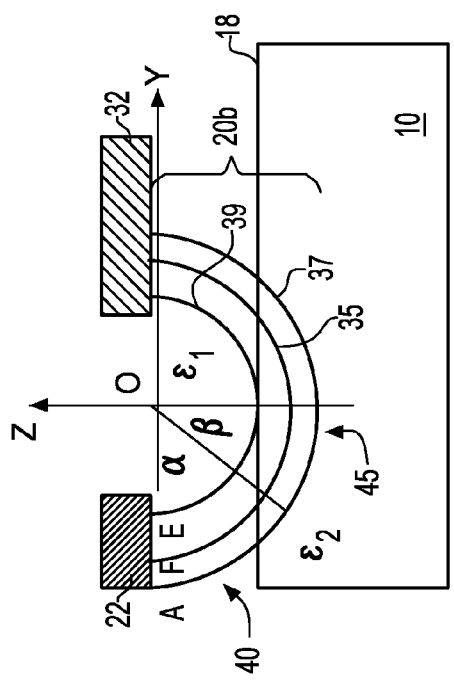
FIG. 7 illustrates a similar field lines pattern as depicted in FIG. 3 including half circle field lines below the signal line and side shield structures and horizontal field lines between the signal line and side shield structures, over the substrate, in which the high frequency limit capacitance formulas is derived for a coupled coplanar T-line structure in the common mode capacitance calculation.
Figure 8:
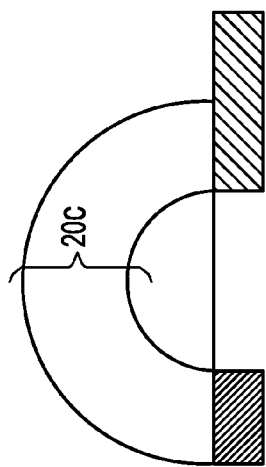
FIG. 8 illustrates a third portion of the field lines approach depicted in FIG. 7 including half circle field lines above the signal line and side shield structures.

What follows are the resultant capacitance calculations (determined expressions) for the field line patterns shown in FIGS. 7 and 8 for the "Common mode" calculation for the structure shown in FIG. 2. The common mode capacitance calculation is very similar to the single mode capacitance calculation, but the field lines are a bit different since it refers to the case of a coupled lines model with the two signal wires having the same potential. In the following calculations, reference is had to FIG. 7 that illustrates a portion of the field lines patterns in FIG. 3 including half circle field lines below the signal line and side shield structures and horizontal field lines between the signal line and side shield structures, over the substrate, in which the high frequency limit capacitance formulas is derived for common mode capacitance calculation. As shown in FIG. 7, the width "w" of each of the conductors is the same. FIG. 8 illustrates a further portion of the field lines pattern depicted in FIG. 7 including half circle field lines above the signal line and side shield structures over the substrate, in which the high frequency limit capacitance formulas is derived for common mode capacitance calculation.

In the following equations, the final capacitance Ccm is determined as a sum of partial capacitance calculation results. For example, the $C_1$ capacitance is the capacitance between the parallel plates (i.e., horizontal field lines pattern between the signal conductor and side shield conductor, the $C_2$ (comprising sub-calculations for $C_{21}$, $C_{22}$) and $C_3$ (comprising sub-calculations for $C_{31}$, $C_{32}$) have the same sense as for Csm calculations. These partial results are obtained from integrating along the field lines in different regions. The details of the derivations are explained in herein incorporated United States Patent Publication No. 2006/0286691.

The actual calculation of the common mode capacitance, Ccm, is now described in greater detail in view of the following equations. As described above, dielectric constants of the substrate regions used in the analysis may be of the order of 4.1 (for $\in_1$, the relative dielectric constant for silicon oxide) and 11.9 (for $\beta_2$, the relative dielectric constant for silicon); however, these are design choices and subject to change.

$$C_1 = Y(1) * \varepsilon_1 * \frac{t}{s}$$

$$C_2 = Y(2) * \varepsilon_1 * \frac{1}{\pi - 2} * \ln\frac{\pi}{2}$$

-continued $$C_3 = Y(3) * \varepsilon_1 * \frac{1}{\pi} * \ln\left(1 + 2 * \frac{w}{s}\right)$$

where Y(k), k=1, 2, ..., n are fitting parameters, whose usage will be discussed herein below.

For the case where the parameters meet the following design criteria:

h>0.5*(w+s), the calculated common mode capacitance Ccm becomes:

$$Ccm = 2*C_1 + 4*C_2 + 4*C_3$$

For the case where the parameters depicted in FIG. 1 meet the following design criteria: 0.5*(w+s)>=h>0.5*s, the $C_3$ capacitance component (comprising partial result calculations for $C_{31}$, $C_{32}$) and the calculated common mode capacitance Ccm are determined as follows:

$$C_{31} = \varepsilon_1 * \frac{1}{\pi} * \ln\left(2 * \frac{h}{s}\right)$$

$x_0 = 0.5*(w+0.5*s+h)$ (an intermediate notation)

$h_0 = \sqrt{x_0*x_0 - h*h}$ (an intermediate notation)

$\in = (h*\in 1 + h0*\in 2)/(h+h0)$ $$C_{32} = \varepsilon * \frac{1}{\pi} * \log\frac{2*w+s}{2*h}$$

$C_{3s} = Y(3)*(C_{31}+C_{32})$ $Ccm = 2*C_1 + 4*C_2 + 2*(C_3+C_{3s})$

For the case where the parameters depicted in FIG. 2 meet the following design criteria:

h<0.5*s, the $C_2$ capacitance component (comprising partial result calculations for $C_{21}$, $C_{22}$) and $C_3$ capacitance component (comprising partial result calculations for $C_{31}$, $C_{32}$) and the calculated common mode capacitance Ccm are determined as follows:

$C_{31} = 0$ $x_0 = 0.5*(w+h)$ (an intermediate notation)

$h_0 = \sqrt{x_0*x_0 - h*h}$ (an intermediate notation)

$\in = (h*\in_1 + h_0*\in_2)/(h+h_0)$ $$C_{32} = \varepsilon * \frac{1}{\pi} * \log\left(1 + \frac{2+w}{s}\right)$$

$C_{3s} = Y(3)*(C_{31}+C_{32})$ $$C_{21} = \varepsilon_1 * \frac{1}{\pi - 2} * \ln\left(1 + \frac{(\pi - 2)*h}{s}\right)$$

$h_0 = 0.5*(0.5*s - h)$ $\in = (\in_1*h + 0.75*\in_2*h_0)/(h+h_0)$ $$C_{22} = \varepsilon * \frac{1}{\pi - 2} * \ln(\pi*s/(2*(\pi-2)*h + 2*s))$$

$C_{2s} = Y(2)*(C_{21}+C_{22})$

As these calculations apply to half of the structure, the capacitance is twice the obtained result:

$Ccm = 2*C_1 + 2*(C_2+C_{2s}) + 2*(C_3+C_{3s})$ where Y(k) are fitting parameters, whose usage will be discussed in further detail herein below.

In view of the foregoing, and, as will be used in the subsequent description, a function for calculating of the single mode capacitance is indicated by: Ccm=commonModePar (w, t, s, h).

Calculation of Single Coplanar T-Line High Frequency Limit Capacitance

The calculation of the high frequency limit capacitance for the single coplanar T-line case is based on the defined function Csm=singleModePar(w, t, S, h). It is noted that for the single coplanar case $C_\infty$=Csm, but for the coupled coplanar case, $C_\infty$ is a 2×2 matrix.

As an example, this function has actually been used for a specific CMOS technology and its accuracy was checked on a random database of 120 cases (all having the same geometry with random parameters) with the reference exact numerical result obtained by an EM solver computing device or like numerical tool which calculates the wire parameters such as capacitance by solving directly the differential equations.

For a first example case, all the fitting coefficients are first set to 1 for this comparison to be made, and then their optimal values are found using a downhill simplex numerical optimization process or any other such optimization technique in which a minimal value of the difference between the semi-analytical and the numerical exact results is found.

Thus, before the numerical fitting, for 120 random samples, the following results were obtained:

Without fitting: X(1)=X(2)=X(3)=1 average error=3.2% max error=7.3% and, after the numerical fitting the following are received:

X=[1.1895 0.9214 1.0407]

average error=2.7% max error=4.6%

Calculation of Coupled Coplanar T-Line High Frequency Limit Capacitance

The calculation of the capacitance matrix for the coupled coplanar T-line case includes separate calculations for the even and odd mode capacitances, which can be readily translated to the self and mutual capacitance values. The Even mode capacitance is obtained by:

$$Ceven = 0.5 * commonModePar(w,t,s,h)$$

The Mutual capacitance is obtained by:

$$Cm = 0.5 * (singleModePar(w,t,s,h) + (singleModePar(w,t,s,h) - Ceven)$$

Odd mode capacitance is then obtained by $$Codd = Ceven + 2*Cm$$

As the field lines in the common mode case depend to an extent on the distance "d" between the conductive signal lines as shown in FIG. 2, accuracy of the result may be improved by adding the additional correction factor:

$$Ceven = Ceven*(1 + 0.025*d/w)$$

For 180 random samples, the following results were obtained for the even mode capacitance calculation:

Without fitting: $Y(1)=Y(2)=Y(3)=1$ average error=3.8% max error=9%

For 180 random samples, the following results were obtained for the odd mode capacitance calculation:

Without fitting: $Y(1)=Y(2)=Y(3)=X(1)=X(2)=X(3)=1$ average error=3.9% max error=11%

For 180 random samples, the following results were obtained for the odd mode capacitance calculation after the numerical fitting as follows:

Calculation of the Even Mode Capacitance (with Fitting Parameters)

$$Y=[1.2561\ 1.0439\ 0.8908]$$

average error=2.5% max error=4.9%

Calculation of the Odd Mode Capacitance (with Fitting Parameters)

$$Y=[11.0954\ 0.8013\ 0.9623], X=[1.1210\ 0.8925\ 1.1406]$$

average error=2.9% max error=5.4%

High Frequency Limit Inductance Calculations

The high frequency limit inductance is calculated from the static capacitance for the case where no silicon substrate exists, which will be denoted by $C_\infty^0$. Thus, the high frequency limit inductance is governed according to the following:

$$L_\infty = tof^2/C_\infty^0$$

where tof is the "time of flight" representing the time it takes for the signal to propagate over a unit distance of a T-line—which is the inverse of the signal propagation speed within this T-line. In lossless T-lines, the propagation speed is the speed of light divided by the effective relative dielectric constant. The prior results obtained can be used as the basis for calculating the capacitance in this special case.

Single Signal Line

The expressions for calculation of $C_\infty^0$ are the same equations used for the calculation of $C_\infty$, however, for the special case of $\epsilon_1 = \epsilon_2$.

For 120 random samples, the following numerical results were obtained for the $C_\infty$ capacitance calculation:

Without fitting: $Y(1)=Y(2)=Y(3)=1$ average error=2.5% max error=5.4%

Fitted results: $Y=[1.0837\ 0.8816\ 1.1418]$ average error=0.5% max error=1%

Two Coupled Signal Lines

For the case of two coupled signal lines, the inductance and mutual inductance are calculated from the corresponding capacitances by the relations:

$$L_\infty = 0.5 * tof^2 * (Codd_\infty^0 + Ceven_\infty^0)/(Codd_\infty^0 * Ceven_\infty^0)$$

$$M_\infty = 0.5 * tof^2 * (Codd_\infty^0 - Ceven_\infty^0)/(Codd_\infty^0 * Ceven_\infty^0)$$

where $Codd_\infty^0$, $Ceven_\infty^0$ are the odd and even mode high frequency limit capacitance for the structure (shown in FIG. 2) but without the silicon substrate. The expressions for calculation $Codd_\infty^0$, $Ceven_\infty^0$, are again the same as the formulas defined herein above for the calculation of odd and even mode high frequency limit capacitance, but for the special case of $\epsilon_1 = \epsilon_2$.

For 180 random samples, the following numerical results were obtained for the even mode capacitance:

Without fitting: $Y(1)=Y(2)=Y(3)=1$ average error 1.1% max error=2.9%

Calculation of the Even Mode Capacitance (with Fitting Parameters)

Fitted results: $Y=[1.1051\ 0.9669\ 1.0002]$ average error=0.7% max error=1.2%

For 180 random samples, the following numerical results were obtained for the Odd mode capacitance:

Without fitting: $Y(1)=Y(2)=Y(3)=X(1)=X(2)=X(3)=1$ average error=2.9% max error=7.1%

Calculation of the Odd Mode Capacitance (with Fitting Parameters)

Fitted results: $Y=[0.8784\ 1.3139\ 1.3495], X=[1.0033\ 1.0033\ 1.2819]$ average error=0.7% max error=1.4%

As mentioned, the present invention of calculating high frequency capacitance $C_\infty$ and inductance $L_\infty$ of a coplanar transmission line structure over the silicon substrate may be encapsulated as a software program such as specialized CAD software running on a computer processor device or like system providing an interface with a designer. The designer controls the design process by appropriate inputs to the system. An IC design system includes a means for modeling capacitance for carrying out the steps of the method described herein. The means for modeling capacitance may be provided in the form of a computer program product.

A method of modeling capacitance for an interconnect structure may actually include steps such as: defining a subject structure; dividing the subject structure into characteristic components; combining the capacitance expressions for each characteristic component, and a capacitance expression for the subject structure is obtained. Optionally, as described herein, the capacitance expression can be fitted using numerical results for the defined structure. The capacitance matrix can be calculated using the capacitance expression.

Using the decomposition approach defined herein, the modeling techniques of the present invention are extendable for the calculation of the crossing lines effect, i.e., other metal conductor which pass orthogonal to the signal lines, most often in the adjacent upper and lower metal layers.

The present invention is typically implemented as a computer program product, comprising a set of program instructions for controlling a computer or similar device. These instructions can be supplied preloaded into a system or recorded on a storage medium such as a CD-ROM, or made available for downloading over a network such as the Internet or a mobile telephone network.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method, implemented by a computer device, of modeling a high frequency limit capacitance of an on-chip interconnect structure including a signal conductor and a proximate side shield structure disposed above a dielectric material layer formed atop a silicon substrate, said method comprising:
   a) estimating a pattern of electric field lines within the silicon substrate and within the dielectric material layer, said estimated pattern of electric field lines comprising a curved field lines portion and straight lines portion between signal conductor and said proximate side shield structure;
   b) providing parameters to said computer device for characterizing, by said computer device said silicon substrate at said high frequency as a non-conductive dielectric material, said estimated pattern of electric field lines in said silicon substrate behaving according to said non-conductive, dielectric material characterization such that an effective dielectric constant $\in$ used for calculating partial capacitance expressions of said on-chip interconnect structure is calculated according to:

$$\alpha/\in_1 + \beta/\in_2 = (\alpha+\beta)/\in$$

wherein said curved field lines portion is divided into two series capacitance sections with a first section subtended by an angle $\alpha$ and a second section subtended by angle $\beta$, said angles defined relative to an intersection of a horizontal axis aligned with a lower surface of said signal conductor of said on-chip interconnect structure and a vertical axis aligned at the midpoint between the signal conductor and said proximate side shield structure, and wherein curved field lines of said first section include lines located in said dielectric material layer having permittivity $\in_1$ and curved field lines of said second section include lines located in said silicon substrate having permittivity $\in_2$;
   c) integrating over said estimated pattern of electric field lines to obtain a relationship between voltage and an electric field for said sections of said structure and obtain respective partial capacitance expressions utilizing said effective dielectric constant $\in$ for said regions that is used to calculate the high frequency capacitance of said on-ship interconnect structure; and,
   d) obtaining a resulting capacitance expression by summing said respective partial capacitance expressions for simulating the electrical behavior of said on-chip interconnect structure in an integrated circuit design system.

2. The method according to claim 1, wherein said on-chip interconnect structure is a single mode transmission line, said field lines approach used to obtain a single mode capacitance Csm expression comprising a function:

$$Csm = \text{singleModePar}(w,t,s,h)$$

where w, t, s, h parameters are input values with: 't' representing a thickness of a signal conducting line; "h" representing a spacing between a signal conducting line and a substrate surface; "w" representing the signal conducting line width; and "s" representing the conducting line separation distance.

3. The method according to claim 1, wherein said on-chip interconnect structure comprises a coupled coplanar T-line structure having two coplanar high frequency signal conducting lines, said field lines approach used to obtain a common mode capacitance Ccm expression comprising a function:

$$Ccm = \text{commonModePar}(w,t,s,h)$$

where w, t, s, h parameters are input values with: "t" representing a thickness of a signal conducting line; "h" representing a spacing between a signal conducting line and a substrate surface; "w" representing the signal conducting line width; and "s" representing the conducting line separation distance.

* * * * *